(12) United States Patent
Lee et al.

(10) Patent No.: US 6,228,736 B1
(45) Date of Patent: May 8, 2001

(54) MODIFIED METHOD FOR FORMING CYLINDER-SHAPED CAPACITORS FOR DYNAMIC RANDOM ACCESS MEMORY (DRAM)

(75) Inventors: Yu-Hua Lee, Hsinchu; James Wu, Kao-Hsiung, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/131,117

(22) Filed: Aug. 7, 1998

(51) Int. Cl.[7] ................................................. H01L 21/20
(52) U.S. Cl. ........................................................ 438/396
(58) Field of Search ..................................... 438/396, 397, 438/399, 239, 253, 254

(56) References Cited

U.S. PATENT DOCUMENTS

| | | | |
|---|---|---|---|
| 5,281,549 | 1/1994 | Fazan et al. | 437/52 |
| 5,354,705 | 10/1994 | Matthews et al. | 437/52 |
| 5,405,796 | 4/1995 | Jones, Jr. | 437/47 |
| 5,597,756 | 1/1997 | Fazan et al. | 437/52 |
| 5,688,713 | 11/1997 | Linliu et al. | 437/60 |
| 5,759,892 | * 6/1998 | Wang et al. | 438/254 |

\* cited by examiner

*Primary Examiner*—David Nelms
*Assistant Examiner*—Quoc Hoang
(74) *Attorney, Agent, or Firm*—George O. Saile; Stephen B. Ackerman

(57) ABSTRACT

A modified method for forming cylinder-shaped stacked capacitors for DRAMs which circumvents oxide erosion due to misalignment is described. A planar silicon oxide ($SiO_2$) first insulating layer is formed over device areas. A silicon nitride ($Si_3N_4$) etch-stop layer is deposited and first openings are etched for capacitor node contacts. A polysilicon layer is deposited and etched back to form node contacts in the first openings. A $Si_3N_4$ second etch-stop layer is deposited and etched back to form protective sidewall spacers in the first openings when the polysilicon node contact is inadvertently overetched. A second $SiO_2$ insulating layer is deposited and second openings for bottom electrodes are etched over the node contacts. A conformal second polysilicon layer is deposited and chemically/mechanically polished back to form the bottom electrodes in the second openings. The second insulating layer is removed by wet etching to the first etch-stop layer. When the second openings are misaligned over the node contact openings, the $Si_3N_4$ sidewall spacers protect the $SiO_2$ first insulating layer from being eroded over the devices on the substrate. The capacitors are now completed by forming an interelectrode dielectric layer on the bottom electrodes, and depositing and patterning a third polysilicon layer for top electrodes.

11 Claims, 6 Drawing Sheets

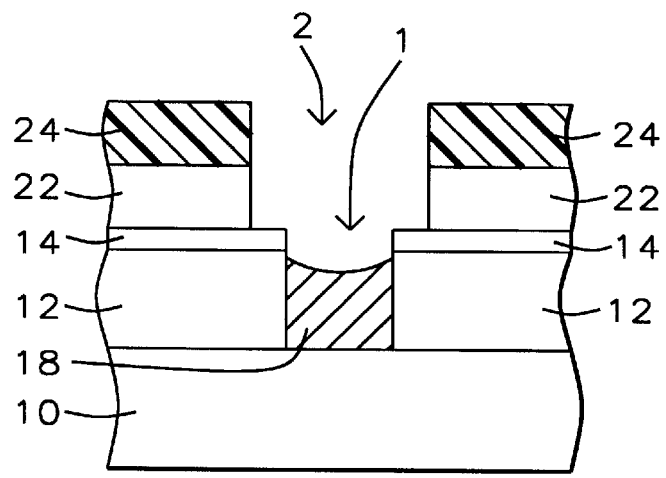
FIG. 1A – Prior Art
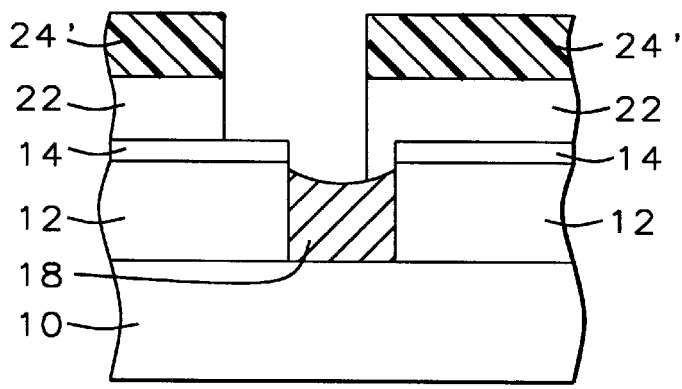
FIG. 1B – Prior Art
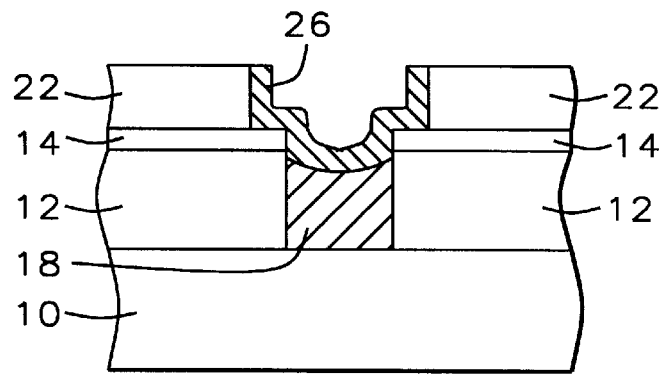
FIG. 2A – Prior Art

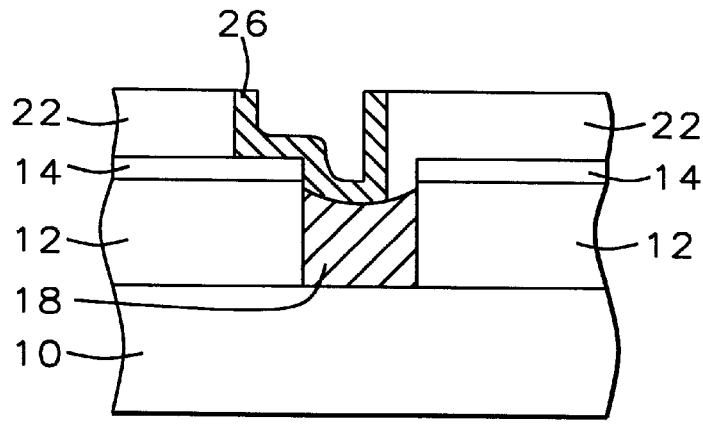
FIG. 2B - Prior Art
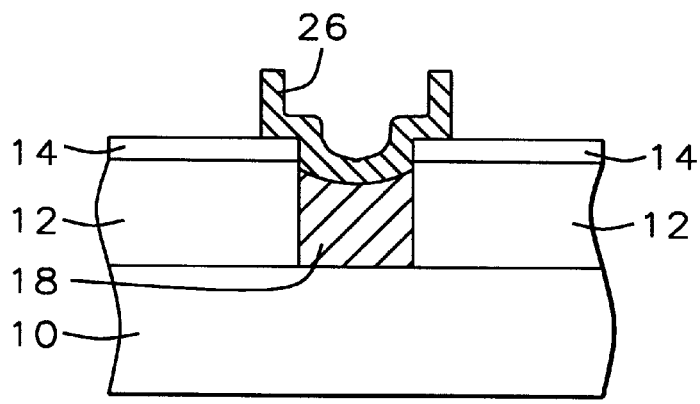
FIG. 3A - Prior Art
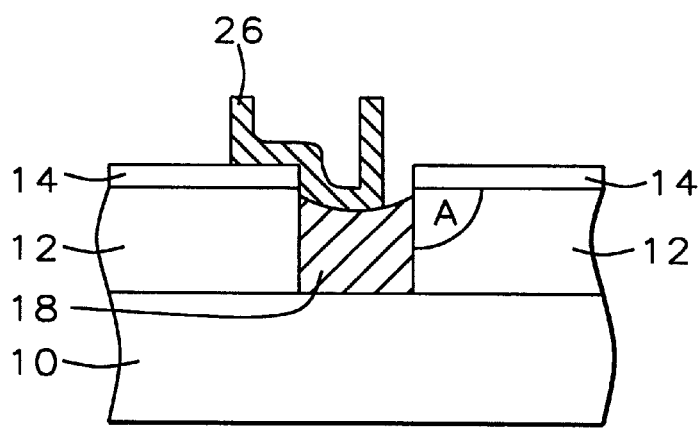
FIG. 3B - Prior Art

MODIFIED METHOD FOR FORMING CYLINDER-SHAPED CAPACITORS FOR DYNAMIC RANDOM ACCESS MEMORY (DRAM)

BACKGROUND OF THE INVENTION

(1) Field of the Invention

The present invention relates to the fabrication of dynamic random access memory (DRAM) devices, and more particularly to a method for fabricating cylinder-shaped stacked capacitors for DRAM cells using an improved semiconductor process. This process eliminates erosion of the insulating layer over the devices on the substrate when misaligned openings in an overlying disposable silicon oxide layer are used as a template for making the DRAM capacitor bottom electrodes.

(2) Description of the Prior Art

Ultra Large Scale Integration (ULSI) technologies have dramatically increased the circuit density on the semiconductor chip. This increase in density is due in part to advances in high-resolution photolithography and anisotropic plasma etching in which the directional ion etching results in essentially bias-free replication of the photoresist image in the underlying patterned layers, such as in polysilicon and insulating oxide layers and the like.

One such circuit type where this high-resolution processing is of particular importance is the dynamic random access memory (DRAM) circuit. This DRAM circuit is used extensively in the electronics industry, and particularly in the computer industry for electrical data storage. The DRAM circuits consist of an array of individual memory cells, each cell consisting of an access transistor, usually a field effect transistor (FET), and a single storage capacitor. Information is stored on the cell as charge on the capacitor, which represents a unit of data (bit), and is accessed by read/write circuits on the periphery of the chip.

One conventional method to achieve a high density of memory cells on a DRAM chip is to form a capacitor node contact to one of the source/drain areas of the FET in each of the memory cells, and then to form a bottom electrode aligned over the node contact. In future technologies having minimum feature sizes less than 0.25 micrometers, misalignment of the bottom electrode to the node contact can result in processing and reliability problems. This problem is best illustrated in FIGS. 1A through 3B for this conventional method. FIG. 1A shows a typical memory cell area on a substrate 10 having a silicon oxide ($SiO_2$) first insulating layer 12 and a silicon nitride ($Si_3N_4$) etch-stop layer 14. A patterned photoresist mask (not shown) and plasma etching are used to etch first openings 1 in layers 14 and 12 for node contacts. A doped first polysilicon layer is deposited and etched back to form the node contact 18 in opening 1. Because of variations in etching conditions and non-uniformities across the substrate, the node contacts 18 can be overetched thereby exposing the sidewalls of the first insulating layer 12. A disposable second insulating layer 22 is deposited, and a second photoresist mask 24 and plasma etching are used to etch second openings in layer 22 for forming the capacitor bottom electrode, as shown in FIG. 1A. However, because of the difficulty of aligning the images for high-density circuits, the photoresist 24 for making the second opening 2 can be misaligned to the node contact 18, as shown in FIG. 1B.

Referring to FIGS. 2A and 2B, a conformal second polysilicon layer is deposited and polished back to form the bottom electrode 26, and as shown in FIG. 3A the disposable $SiO_2$ second insulating layer 22 is removed using a wet etch in a hydrofluoric acid solution. The $Si_3N_4$ etch-stop layer 14 prevents the etchant from attacking the first insulating layer 12 over the devices on the substrate. However, as shown in FIG. 3B for the misaligned opening 2 for the bottom electrode, when the second insulating layer 22 is etched, the first insulating layer 12 is also etched or eroded away at the point A, which can cause electrical shorts and other reliability problems. Therefore, it is desirable to modify the conventional method to prevent this oxide erosion problem.

There are numerous methods of making DRAM circuits with stacked capacitors that are reported in the literature. Several methods for making DRAM capacitors are described by Fazan et al., in U.S. Pat. No. 5,597,756, by Matthews et al., in U.S. Pat. No. 5,354,705, by Jones et al., in U.S. Pat. No. 5,405,796, and by Linliu et al., in U.S. Pat. No. 5,688,713.

However, none of the cited patent references explicitly addresses the problems associated with misalignment and erosion of the oxide. Therefore, there is still a need to improve upon the conventional method for fabricating reliable DRAM capacitors on memory cells.

SUMMARY OF THE INVENTION

It is a principal object of the present invention to provide a method for making memory cells on DRAM devices with improved cylinder-shaped stacked capacitors having increased capacitance.

It is another object of this invention to provide a more controllable etch process using a protective silicon nitride ($Si_3N_4$) layer having sidewall spacers. This layer prevents erosion of an underlying silicon oxide ($SiO_2$) over the devices on the substrate when a disposable overlying $SiO_2$ layer, used to form the capacitor, is removed in a wet etch.

Still another object of this invention is to provide a cost-effective manufacturing process.

The invention begins by providing a semiconductor substrate (wafer) composed of single crystalline silicon. The details for the semiconductor devices in the substrate are not explicitly described in detail since they are not essential to understanding the invention. But typically the memory cells on a substrate for DRAM circuits have device areas surrounded and electrically isolated by field oxide (FOX) regions and semiconductor devices such as field effect transistors (FETs) in the device areas. A storage capacitor is then formed over each of the memory cell areas to one of the device contact areas using a polysilicon plug as the node contact.

Continuing with the process, the method for making these improved cylinder shaped capacitors using this modified method to avoid silicon oxide erosion when misalignment of the capacitor to the polysilicon plug (node contact) occurs is described. A first insulating layer is deposited on the substrate, which is then planarized. The first insulating layer is a silicon oxide ($SiO_2$) or a doped oxide such as a borophosphosilicate glass (BPSG). A first etch-stop layer, preferably composed of silicon nitride ($Si_3N_4$), is then deposited on the first insulating layer. First openings are selectively etched for capacitor node contacts in the first etch-stop layer and in the first insulating layer to the device areas. A conductively doped first polysilicon layer is deposited to fill the first openings, and is etched back to form polysilicon plugs in the first openings. Unfortunately, it is difficult to consistently etch back the polysilicon because of run-to-run process variations, and because of etch non-uniformity across the wafer. This overetching can cause erosion of the SiO$_2$ first insulating layer in subsequent steps if and when misalignment occurs. By the method of this invention, a second etch-stop layer is deposited and is etched back to form sidewall spacers that protect the exposed first insulating layer at the sidewalls in the first openings in which the first polysilicon layer is overetched. A second insulating layer is deposited on the first etch-stop layer and over the sidewall spacers formed from the second etch-stop layer and over the polysilicon plugs. Second openings are selectively etched, aligned over and wider than the first openings, in the second insulating layer. The second openings are etched to the first etch-stop layer and to the polysilicon plugs. However, because of the more critical design rules for alignment, misalignment of the second opening to the first opening can occur, and in the conventional process without etch-stop sidewall spacers can result in erosion of the first insulating layer during later processing steps. Next a conformal second polysilicon layer is deposited over and in the second openings and is polished back to form bottom electrodes contacting the polysilicon plugs in the second openings. The disposable second insulating layer is then isotropically and selectively etched to the first etch-stop layer to leave free-standing bottom electrodes, while the sidewall spacers formed from the second etch-stop layer prevent etching (erosion) of the first insulating layer when the second openings are misaligned to the first openings. The DRAM capacitors are now completed by depositing an interelectrode dielectric layer on the bottom electrodes, and then depositing and patterning a third polysilicon layer to form top electrodes for the cylinder-shaped capacitors.

BRIEF DESCRIPTION OF THE DRAWINGS

The objects and other advantages of this invention are best understood in the preferred embodiment with reference to the attached drawings, which are now briefly described.

FIGS. 1 through 3B are schematic cross-sectional views showing the sequence of process steps for making a conventional DRAM capacitor having misalignment resulting in oxide erosion.

DESCRIPTION OF THE PREFERRED EMBODIMENT

Now in keeping with the objects of the invention, the method for forming the cylinder-shaped storage capacitors is covered in detail. These improved capacitors can be used on DRAM circuits having FET structures that are currently utilized in the manufacture of DRAMs. Therefore, only those details of the underlying substrate structure will be described that are necessary for understanding the current invention for making these improved capacitors. It should also be well understood by those skilled in the art that by including additional processing steps, other types of devices can also be included on the DRAM chip. For example, by providing N and P doped wells, both P-channel and N-channel FETs can be formed for fabricating CMOS circuits, as are commonly used in the peripheral circuits of the chip.

Figure 4:
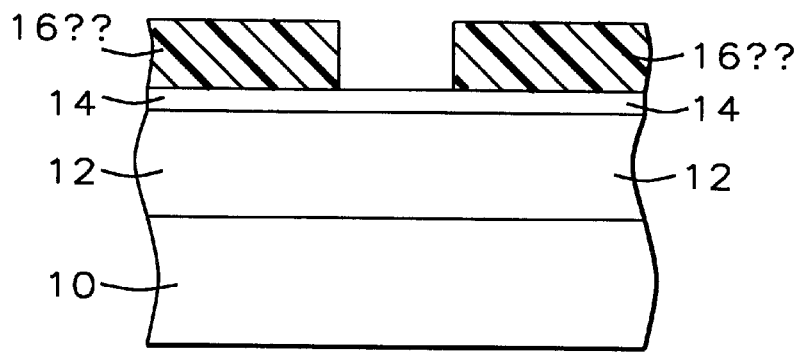
FIGS. 4 through 13 are schematic cross-sectional views showing the sequence of process steps for making a modified DRAM capacitor by the method of this invention, which eliminates the oxide erosion problem.

Referring now to FIG. 4, a cross-sectional view is shown of a portion of a substrate 10 having a partially completed DRAM cell. The preferred substrate is composed of a P-type single-crystal silicon with a <100> crystallographic orientation. The details for the semiconductor devices in and on the substrate are not explicitly depicted in the drawings and are not described in detail since they are fabricated as commonly practiced in the industry and are not essential for understanding the invention. However, the memory cells on a substrate for DRAM circuits typically have device areas surrounded and electrically isolated by field oxide (FOX) regions and semiconductor devices such as field effect transistors (FETs) in the device areas. The storage capacitor is then formed over each of the memory cell areas to one of the device contact areas using a polysilicon plug as the node contact. Only one of the many node contacts to device areas is depicted in FIG. 4.

Still referring to FIG. 4 the method for making the improved cylinder-shaped capacitors is now described. A first insulating layer 12 is deposited on the substrate to insulate the semiconductor devices (not shown) on the substrate 10. Layer 12 is preferably SiO$_2$, and is deposited using LPCVD and a reactant gas such as tetraethosiloxane (TEOS). Alternatively, layer 12 can be a borophosphosilicate glass (BPSG) deposited by LPCVD using TEOS, and is doped with boron and phosphorus during the silicon oxide deposition. The first insulating layer 12 is then planarized. For example, layer 12 can be planarized using chemical/mechanical polishing (CMP) to provide global planarization. Alternatively, if a BPSG is used, the layer can be leveled by thermal annealing. The thickness of layer 12 after planarizing is preferably between about 4000 and 8000 Angstroms over the underlying semiconductor devices on the substrate 10. A first etch-stop layer 14, preferably composed of silicon nitride (Si$_3$N$_4$), is then deposited on the first insulating layer 12. Layer 14 is preferably deposited by LPCVD using a reactant gas mixture such as dichlorosilane (SiCl$_2$H$_2$) and ammonia (NH$_3$), and is deposited to a preferred thickness of between about 100 and 1000 Angstroms. Conventional photolithographic techniques are used to make a photoresist mask 16 for etching first contact openings.

Figure 5:
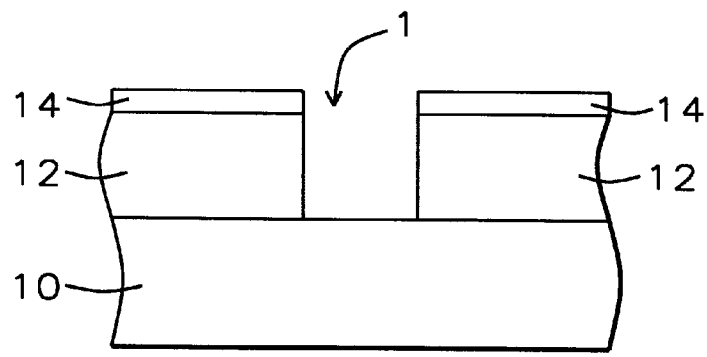

As shown in FIG. 5, first contact openings 1 are etched in the etch-stop layer 14 and the first insulating layer 12 over the device areas (memory cell areas) on the substrate 10 for capacitor node contacts. Preferably the etching is an anisotropic plasma etching carried out in a high-density plasma (HDP) etcher using an etchant gas mixture such as carbon tetrafluoride (CF$_4$), trifluoromethane (CHF$_3$), perfluoroisobutylene (C$_4$F$_8$), carbon monoxide (CO), and argon (Ar) having a high etch-rate selectivity of SiO$_2$ to silicon.

Figure 6:
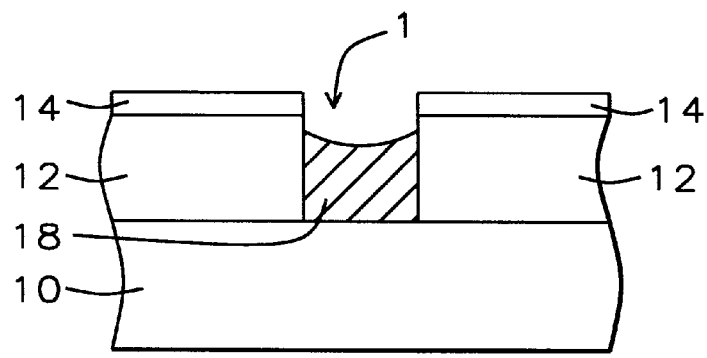

Referring to FIG. 6, after removing the photo-resist mask, a conformal first polysilicon layer 18 is deposited and etched back to form polysilicon plugs 18 in the first openings 1. Layer 18 is preferably deposited by LPCVD using, for example, silane (SiH$_4$) as the reactant gas, and is in-situ doped with an N type dopant such as phosphorus to a concentration of between 1.0 E 19 and 1.0 E 21 atoms/cm$^3$. Layer 18 is deposited to a thickness sufficient to fill the first contact openings 1 and more specifically to a thickness of between about 2000 and 5000 Angstroms.

Unfortunately, the variations in the deposition thickness of the polysilicon layer 18 across the substrate and the variations in etching back across the substrate and from run to run makes it difficult to consistently etch back each polysilicon plug 18 to the top surface of first etch-stop layer 14 without overetching some of the plugs, as depicted in FIG. 6 for one of the overetched plugs. This overetching exposes the sidewalls of the SiO$_2$ first insulating layer 12 in the first openings 1. This exposure can cause erosion of the SiO$_2$ first insulating layer in subsequent processing steps of the conventional process when misalignment occurs at the next level of processing.

Figure 7:
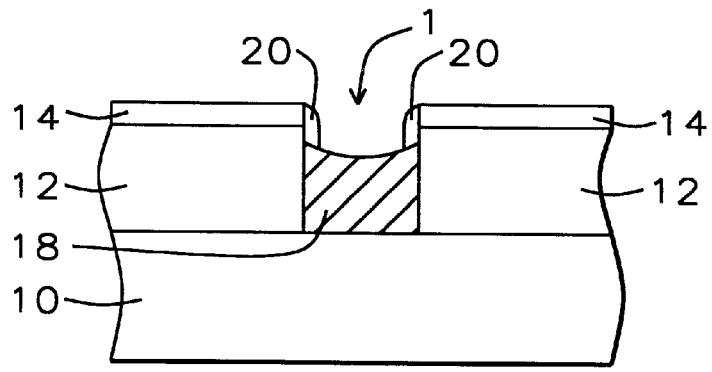

To avoid this erosion problem, the method of this invention utilizes a second etch-stop layer 20 for forming sidewall spacers 20 in the first openings 1, as depicted in FIG. 7. Layer 20 is preferably composed of silicon nitride ($Si_3N_4$) and is deposited by LPCVD using, for example, a reactant gas mixture such as dichlorosilane ($SiCl_2H_2$) and ammonia ($NH_3$), and is deposited to a preferred thickness of between about 200 and 1000 Angstroms. Layer 20 is anisotropically etched back using HDP etching and an etchant gas mixture such as sulfur hexafluoride ($SF_6$), $CF_4$, $CHF_3$, and Ar to form sidewall spacers, also labeled 20, that protect the exposed first insulating layer 12 at the sidewalls in the first openings 1 when the first polysilicon layer 18 is inadvertently overetched during formation of the polysilicon plugs. The anisotropic plasma etching of layer 20 can be controlled by a timed etch.

Figure 8:
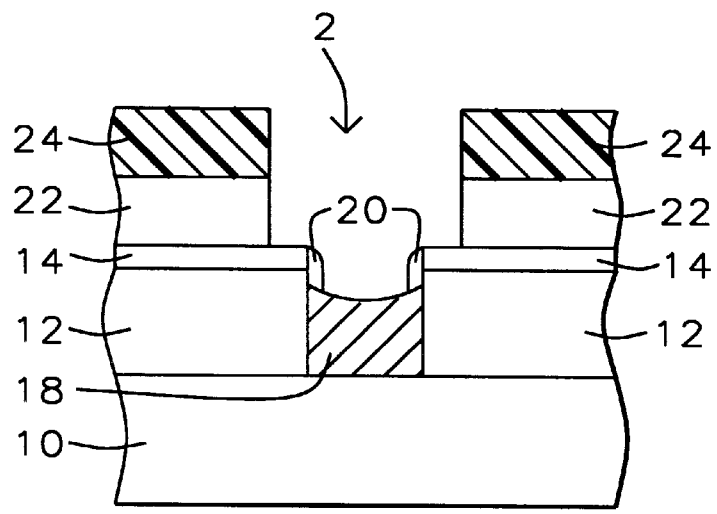

Referring to FIG. 8, a blanket second insulating layer 22 is deposited over the first etch-stop layer 14 and over the sidewall spacers 20 formed from the second etch-stop layer and over the polysilicon plugs 18. Layer 22 is preferably a silicon oxide deposited by LPCVD using a reactant gas mixture of TEOS/$O_3$, and is deposited to a thickness of between about 4000 and 8000 Angstroms. As also shown in FIG. 8, a photoresist mask 24 is patterned and anisotropic plasma etching is used to form second openings 2 in layer 22. Openings 2 are etched selectively to the underlying first etch-stop layer 14, and are aligned over and wider than the first openings 1. Preferably the selective anisotropic plasma etching is carried out in a HDP etcher using an etchant gas mixture of $CF_4$, $CHF_3$, $C_4F_8$, CO, and Ar, which has an etch-rate selectivity of $SiO_2$ to $Si_3N_4$ of about 10:1.

However, because of the more critical design rules for alignment, misalignment of the second opening to the first opening can occur, and in the conventional process without etch-stop sidewall spacers can result in erosion of the first insulating layer during later processing steps.

Figure 9:
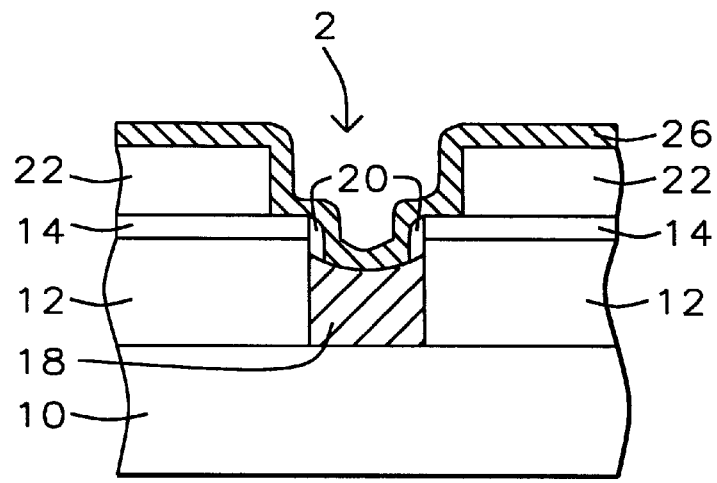

Referring to FIG. 9, after removing the photo-resist mask 24, for example by plasma ashing in oxygen, a conformal second polysilicon layer 26 is deposited over the second insulating layer 22 and in the second openings 2, making electrical contact to the polysilicon plugs 18. Preferably polysilicon layer 26 is deposited by LPCVD using, for example, $SiH_4$, and is in-situ doped with phosphorus to a concentration of between about 1.0 E 19 and 1.0 E 21 atoms/$cm^3$. Layer 26 is deposited to a thickness of between about 500 and 2000 Angstroms.

Figure 10:
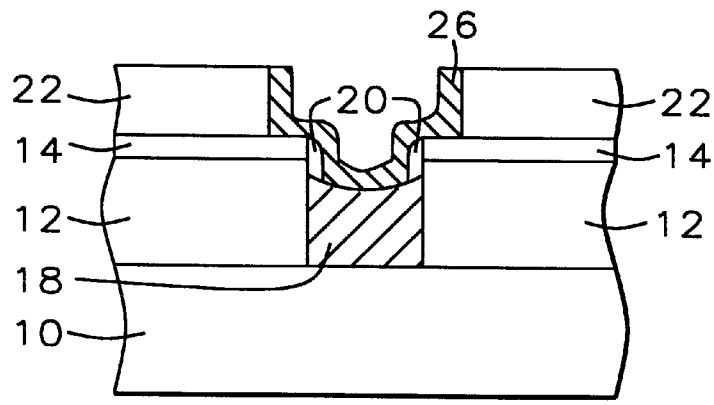

As shown now in FIG. 10, the second polysilicon layer 26 is chemically/mechanically polished back to form capacitor bottom electrodes, also labeled 26.

Figure 11:
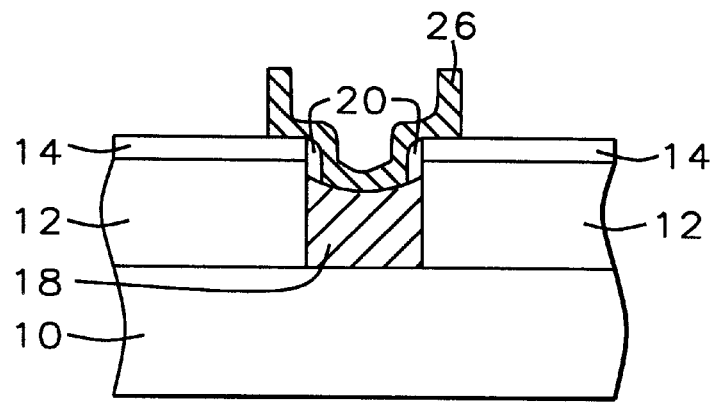

Referring to FIG. 11, the disposable $SiO_2$ second insulating layer 22 is then isotropically etched to the first etch-stop layer 14 to leave free-standing bottom electrodes 26. The etching is carried out preferably using a hydrofluoric (HF) acid solution.

Figure 12:
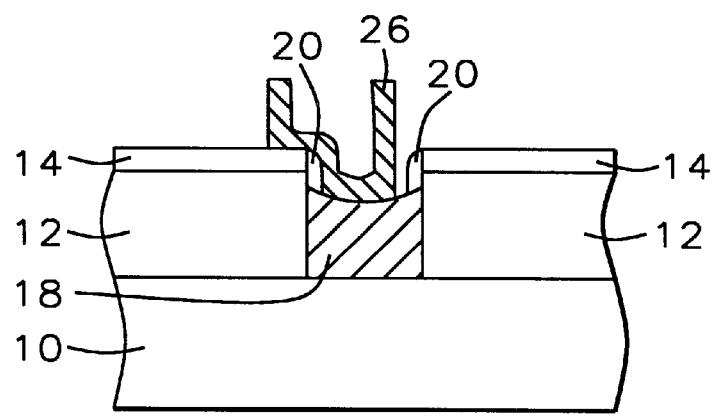

As shown in FIG. 12, when the second opening 2 is etched in the insulating layer 22 as shown in FIG. 8, but is misaligned, then resulting capacitor bottom electrode structure (26) appears as in FIG. 12. The $Si_3N_4$ sidewall spacers 20 of this invention protect the first insulating layer 12 from etching (erosion), thereby protecting the insulation over the devices in and on the substrate 10, that would otherwise occur in the more conventional process shown in the prior-art FIG. 3B.

Figure 13:
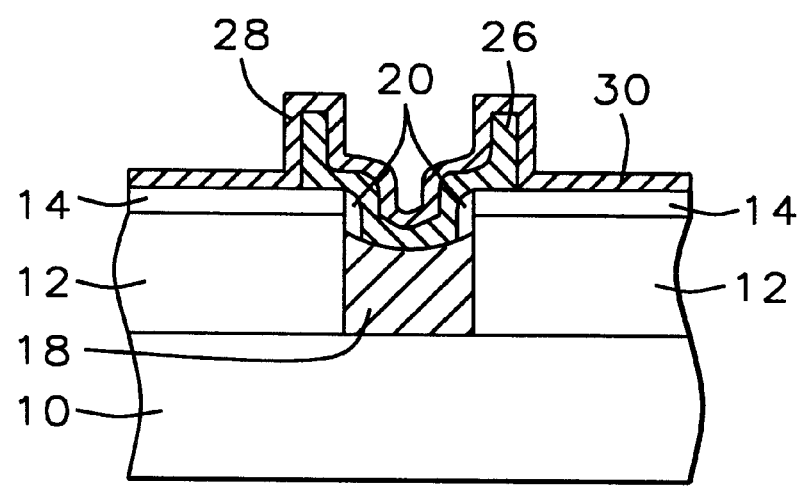

Referring to FIG. 13, the DRAM cylindrical capacitors are now completed by depositing an interelectrode dielectric layer 28 on the bottom electrodes 26, and forming the capacitor top electrodes by depositing and patterning a third polysilicon layer 30. The interelectrode dielectric layer 28 is formed on the surface of the bottom electrodes. The dielectric layer 28 is preferably between about 30 and 100 Angstroms thick, and is composed of a material having a high dielectric constant that is compatible with the polysilicon processing, and is continuous and pin-hole free. The preferred interelectrode dielectric layer is composed of silicon oxide-silicon nitride (ON) or a silicon oxide-silicon nitride-silicon oxide (ONO) layer. For example, the surface of the polysilicon bottom electrode 26 can be thermally oxidized to form the $SiO_2$, and then a thin conformal $Si_3N_4$ layer can be deposited using LPCVD to form the ON layer. To form the ONO layer, the exposed surface of the $Si_3N_4$ layer can then be reduced in an oxidizing ambient at elevated temperatures. Additionally, the surface of the polysilicon bottom electrodes 26 can be roughened to further increase the surface area and the capacitance. Other high-dielectric constant insulators can also be used, such as tantalum pentoxide ($Ta_2O_5$) and the like.

Still referring to FIG. 13, the third polysilicon layer 30 is deposited over the interelectrode dielectric layer 28, and is then patterned using conventional photolithographic and plasma etching techniques to form the top electrodes 30. The third polysilicon layer 30 is preferably deposited by LPCVD to a thickness of between about 500 and 2000 Angstroms, and is in-situ doped with an N-type dopant, such as phosphorous (P), having a preferred concentration in the range of between about 1.0 E 19 to 1.0 E 21 atoms/$cm^3$ While the invention has been particularly shown and described with reference to the preferred embodiment thereof, it will be understood by those skilled in the art that various changes in form and detail may be made without departing from the spirit and scope of the invention.

What is claimed is:

1. A method for fabricating cylinder-shaped stacked capacitors for memory devices comprising the steps of:

providing a semiconductor substrate having device areas with semiconductor devices;

forming a planar first insulating layer over said device areas on said substrate;

depositing a first etch-stop layer composed of silicon nitride on said planar first insulating layer;

selectively etching first openings for capacitor node contacts in said first etch-stop layer and said first insulating layer to said device areas;

depositing a conductively doped first polysilicon layer to fill said first openings, and etching back said first polysilicon layer to form polysilicon plugs in said first openings;

depositing and etching back a second etch-stop layer composed of silicon nitride to form sidewall spacers to protect the sidewalls in said first openings when said first polysilicon layer is overetched;

depositing a second insulating layer on said first etch-stop layer and on said sidewall spacers formed from said second etch-stop layer and over said polysilicon plugs;

selectively etching second openings, over and wider than said first openings, in said second insulating layer to said first etch-stop layer and to said polysilicon plugs;

depositing a conformal second polysilicon layer over and in said second openings and contacting said polysilicon plugs;

polishing back said second polysilicon layer to said second insulating layer to form bottom electrodes in said second openings;

isotropically etching said second insulating layer selectively to said first etch-stop layer to leave free-standing said bottom electrodes, while said sidewall spacers protect said first insulating layer from erosion when said second openings are misaligned to said first openings;

depositing an interelectrode dielectric layer on said bottom electrodes;

depositing and patterning a third polysilicon layer to form top electrodes and completing said cylinder-shaped capacitors.

2. The method of claim 1, wherein said first insulating layer is silicon oxide, and has a thickness of between about 4000 and 8000 Angstroms after planarizing.

3. The method of claim 1, wherein said first etch-stop layer has a thickness of between about 100 and 1000 Angstroms.

4. The method of claim 1, wherein said first polysilicon layer is doped with conductive impurities to a concentration of between about 1.0 E 17 and 1.0 E 21 atoms/cm$^3$, and is deposited to a thickness of between about 2000 and 5000 Angstroms.

5. The method of claim 1, wherein said second etch-stop layer has a thickness of between about 200 and 1000 Angstroms, and where said etching back to form said sidewall spacers is an anisotropic plasma etch.

6. The method of claim 1, wherein said second insulating layer is silicon oxide and is deposited to a thickness of between about 4000 and 8000 Angstroms.

7. The method of claim 1, wherein said second polysilicon layer is conductively doped in-situ to a concentration of between about 1.0 E 19 and 1.0 E 21 atoms/cm$^3$, and is deposited to a thickness of between about 500 and 2000 Angstroms.

8. The method of claim 1, wherein said isotropic etching of said second insulating layer is carried out in a hydrofluoric acid solution.

9. The method of claim 1, wherein said inter-electrode dielectric layer is silicon oxide/silicon nitride/silicon oxide (ONO), and has a thickness of between about 30 and 100 Angstroms.

10. The method of claim 1, wherein said third polysilicon layer is doped with conductive impurities to a concentration of between about 1.0 E 19 and 1.0 E 21 atoms/cm$^3$, and has a thickness of between about 500 and 2000 Angstroms.

11. The method of claim 1, wherein said second etch-stop layer is anisotropically etched back using a reactive ion etcher and an etchant gas mixture composed of $SF_6$, $CF_4$, $CHF_3$, and Ar.

* * * * *